United States Patent
Nomiya (10) Patent No.: US 8,304,661 B2
(45) Date of Patent: Nov. 6, 2012

(54) CERAMIC COMPOSITE MULTILAYER SUBSTRATE, METHOD FOR MANUFACTURING CERAMIC COMPOSITE MULTILAYER SUBSTRATE AND ELECTRONIC COMPONENT

(75) Inventor: Masato Nomiya, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 248 days.

(21) Appl. No.: 12/787,415

(22) Filed: May 26, 2010

(65) Prior Publication Data

US 2010/0224396 A1    Sep. 9, 2010

Related U.S. Application Data

(63) Continuation of application No. PCT/JP2008/068879, filed on Oct. 17, 2008.

(30) Foreign Application Priority Data

Nov. 30, 2007    (JP) ................. 2007-311632

(51) Int. Cl.
*H05K 1/00* (2006.01)
*H01K 3/22* (2006.01)
(52) U.S. Cl. ................ 174/258; 174/259; 29/851
(58) Field of Classification Search .......... 361/792–795; 174/255–259; 29/851
See application file for complete search history.

(56) References Cited

U.S. PATENT DOCUMENTS

| | | |
|---|---|---|
| 2002/0157760 A1 | 10/2002 | Mandai et al. |
| 2003/0211302 A1 | 11/2003 | Mandai et al. |

FOREIGN PATENT DOCUMENTS

| | | |
|---|---|---|
| EP | 0 954 209 A1 | 11/1999 |
| EP | 1 304 909 A1 | 4/2003 |
| EP | 2 026 379 A1 | 2/2009 |
| JP | 5-136572 A | 6/1993 |
| JP | 2000-25157 A | 1/2000 |
| JP | 2002-344121 A | 11/2002 |
| JP | 2003-124435 A | 4/2003 |
| JP | 2005-210036 A | 8/2005 |
| JP | 2005-223226 A | 8/2005 |
| JP | 2006-100443 A | 4/2006 |
| JP | 2006-278453 A | 10/2006 |
| JP | 2007-317711 A | 12/2007 |
| JP | 2008-21883 A | 1/2008 |
| WO | 2007/142033 A1 | 12/2007 |

OTHER PUBLICATIONS

Official Communication issued in corresponding Japanese Patent Application No. 2009-543717, mailed on Nov. 15, 2011.
Official Communication issued in International Patent Application No. PCT/JP2008/068879, mailed on Nov. 11, 2008.
Official Communication issued in corresponding Chinese Patent Application No. 200880118676.3, mailed on Dec. 26, 2011.

*Primary Examiner* — Jeremy Norris
(74) *Attorney, Agent, or Firm* — Keating & Bennett, LLP (57) ABSTRACT

A high-reliability ceramic composite multilayer substrate that has excellent flatness and few remaining pores, can be produced at a low cost while simplifying the manufacturing process, and can eliminate layer separation or separation from a mother board. The ceramic composite multilayer substrate includes a laminate containing a first ceramic layer and a second ceramic layer that is disposed so as to contact the first ceramic layer and suppresses firing shrinkage in the plane direction of the first ceramic layer. The laminate includes a resin/ceramic composite layer in which porous ceramic is impregnated with a resin formed on at least one principal surface of the laminate.

20 Claims, 7 Drawing Sheets

CERAMIC COMPOSITE MULTILAYER SUBSTRATE, METHOD FOR MANUFACTURING CERAMIC COMPOSITE MULTILAYER SUBSTRATE AND ELECTRONIC COMPONENT

BACKGROUND OF THE INVENTION

1. Field of the Invention

The present invention relates to a ceramic composite multilayer substrate, a method for manufacturing the same, and electronic components.

2. Description of the Related Art

As techniques relating to ceramic multilayer substrates, the techniques described in Japanese Unexamined Patent Application Publication No. 05-136572, Japanese Unexamined Patent Application Publication No. 2005-210036 and Japanese Unexamined Patent Application Publication No. 2005-223226 are known, for example. Japanese Unexamined Patent Application Publication No. 05-136572 describes a method for manufacturing a multilayer ceramic substrate, and Japanese Unexamined Patent Application Publication No. 2005-210036 and Japanese Unexamined Patent Application Publication No. 2005-223226 each describes a composite multilayer substrate.

The method for manufacturing a multilayer ceramic substrate described in Japanese Unexamined Patent Application Publication No. 05-136572 includes producing a green sheet at least containing an organic binder and a plasticizer in a glass ceramic low-temperature sintered substrate material, forming an electrode pattern with a conductive paste composition, and laminating the raw sheet and a required number of other green sheets on which an electrode pattern have been formed. After an appropriate period of time, a green sheet containing an inorganic composition that is not sintered at the firing temperature of the glass/ceramic low-temperature sintered substrate material is laminated on both sides or either side of the green sheet laminate containing low-temperature sintered glass/ceramics so as to be interposed, and firing the laminate. After an appropriate period of time, the inorganic composition that is not sintered is charged with a resin to form a top layer wiring.

A composite multilayer substrate described in Japanese Unexamined Patent Application Publication No. 2005-210036 has a ceramic substrate and a resin layer, in which the ceramic substrate has a circuit pattern, the resin layer has an external terminal electrode on the undersurface, the undersurface of the ceramic substrate and the upper surface of the resin layer are joined to each other, the circuit pattern and the external terminal electrode are electrically connected to each other, and the thermal expansion coefficient of the ceramic substrate is in the range of 10.0 ppm/° C. to 20.0 ppm/° C. at 20° C. to 300° C. Since the composite multilayer substrate has such a structure, layer separation between the ceramic substrate and the resin layer can be prevented.

A composite multilayer substrate described in Japanese Unexamined Patent Application Publication No. 2005-223226 is a composite multilayer substrate having a ceramic multilayer substrate and a resin laminate in which a first resin layer, a second resin layer, and a third resin layer are laminated, in which the undersurface of the ceramic multilayer substrate and the upper surface of the resin laminate are joined to each other and the first, second, and third resin layers each have a different thermal expansion coefficient. In this composite multilayer substrate, a gradient structure is given to the thermal expansion coefficient because there is a possibility that layer separation or cracks may occur due to thermal shock at an interface having a large thermal expansion coefficient difference when the thermal expansion coefficient of a composite resin material layer is adjusted to the thermal expansion coefficient of either one of the ceramic substrate or a printed-circuit board.

According to the method described in Japanese Unexamined Patent Application Publication No. 05-136572 including sandwiching a laminate containing a ceramic green sheet for a base material layer containing a glass/ceramic low-temperature sintered compact substrate material and having a given electrode pattern with a ceramic green sheet for a constraining layer containing an inorganic composition that is not sintered at the firing temperature of the glass/ceramic low-temperature sintered compact substrate material and having a given electrode pattern, firing the same, charging a resin into the non-sintering inorganic composition, and, after an appropriate period of time, forming the top surface wiring has the following problems. The multilayer ceramic substrate itself tends to undergo firing shrinkage. Therefore, the porosity particularly near the interface of the multilayer ceramic substrate of the non-sintering inorganic composition layer becomes small. Therefore, the resin cannot be sufficiently charged into the portion, and the pores sometimes remain. Moreover, the resin charged state is likely to vary, and the reliability of the obtained substrate sometimes decreases.

According to the techniques of Japanese Unexamined Patent Application Publication No. 2005-210036 and Japanese Unexamined Patent Application Publication No. 2005-223226, even when the thermal expansion coefficient difference between the printed-circuit board and the ceramic substrate is large when the composite multilayer substrate is mounted on the printed-circuit board, the generation of cracks due to the thermal expansion coefficient difference between the printed-circuit board and the ceramic substrate can be prevented by the resin layer or the resin laminate. However, when the ceramic substrate is warped before the formation of the resin layer or the ceramic substrate is warped due to the formation of the resin layer, cracks are likely to occur. In recent years, a reduction in the height of ceramic electronic devices has been strongly demanded and a further reduction in the thickness of the ceramic substrate has been demanded. Due to the reduction in the layer thickness, the ceramic substrate is likely to be warped or cracks are likely to occur during resin curing. In such a case, the generation of cracks is difficult to suppress.

In particular, the technique of Japanese Unexamined Patent Application Publication No. 2005-223226 is required to form at least two resin layers and to form a conductor wiring portion for every resin layer, for example. Thus, the technique of Japanese Unexamined Patent Application Publication No. 2005-223226 requires a greater number of processes other than the process of forming two or more resin layers. Furthermore, since the resin layer is formed more than once, position shift or the like occurs between the resin layers while laminating the resin layers, reducing the lamination accuracy so as to deteriorate the shape of the resin layers deteriorates, and thus the composite multilayer substrate is likely to deform.

In addition to the reduction in the height, the composite multilayer substrate is required to reduce irregularities (small wave-like distortions) on the ceramic substrate. According to the method including forming the resin layer more than once, it has been difficult to make the thickness of the ceramic substrate uniform after the formation of the substrate is completed and moreover it has been difficult to smooth the resin layer on the substrate surface. Moreover, when the resin layer is formed more than once, it has been required to form a wiring structure whenever forming each resin layer. Accordingly, the same process is repeatedly performed when forming the resin layer, which has caused problems in that the manufacturing method has become complicated and structural defects have been likely to occur when forming a wiring structure.

SUMMARY OF THE INVENTION

In order to solve the above-described problems, preferred embodiments of the present invention provide a high-reliability ceramic composite multilayer substrate that has excellent flatness and few remaining pores, can be produced at a low cost while simplifying the manufacturing process, and can eliminate layer separation or separation from a mother board, for example, a method for manufacturing the same, and electronic components.

A ceramic composite multilayer substrate according to a preferred embodiment of the present invention includes a laminate including a first ceramic layer and a second ceramic layer that is disposed so as to contact the first ceramic layer and to suppress firing shrinkage in the plane direction of the first ceramic layer, in which the laminate includes a resin/ceramic composite layer in which porous ceramic is impregnated with a resin provided on at least one principal surface of the laminate.

It is preferable in the ceramic composite multilayer substrate of a preferred embodiment of the present invention that the second ceramic layer be disposed between two or more of the first ceramic layers.

It is more preferable in the ceramic composite multilayer substrate of a preferred embodiment of the present invention that the second ceramic layer be disposed between the first ceramic layer and the resin/ceramic composite layer.

It is still more preferable in the ceramic composite multilayer substrate of a preferred embodiment of the present invention that the resin/ceramic composite layer be disposed on each of both the principal surfaces of the laminate containing the first ceramic layer and the second ceramic layer.

It is still more preferable in the ceramic composite multilayer substrate of a preferred embodiment of the present invention that the resin/ceramic composite layer be disposed only on one principal surface of the laminate containing the first ceramic layer and the second ceramic layer.

It is still more preferable in the ceramic composite multilayer substrate of a preferred embodiment of the present invention that a resin layer containing a resin as the main ingredient be disposed on the surface of the resin/ceramic composite layer.

It is still more preferable in the ceramic composite multilayer substrate of a preferred embodiment of the present invention that a surface electrode be provided on the interface between the resin/ceramic composite layer and the resin layer and one principal surface of the surface electrode be exposed to the outside.

It is still more preferable in the ceramic composite multilayer substrate of a preferred embodiment of the present invention that at least one portion of the edge portion of the surface electrode be covered with the resin layer.

It is still more preferable in the ceramic composite multilayer substrate of a preferred embodiment of the present invention that the resin layer covering at least one portion of the edge portion of the surface electrode is formed with a resin containing the same material as that of the resin contained in the resin/ceramic composite layer.

It is still more preferable in the ceramic composite multilayer substrate of a preferred embodiment of the present invention that when a cavity is formed in at least one principal surface, at least the second ceramic layer or the resin/ceramic composite layer among the first ceramic layer, the second ceramic layer, and the resin/ceramic composite layer be exposed to the side wall surface or the bottom surface of the cavity.

A method for manufacturing a ceramic composite multilayer substrate according to another preferred embodiment of the present invention includes the steps of producing a non-fired composite laminate in which a third ceramic green layer serving as a porous ceramic layer after firing is provided on at least one principal surface of a non-fired laminate in which a second ceramic green layer capable of suppressing firing shrinkage in the plane direction of a first ceramic green layer is disposed on at least one principal surface of the first ceramic green layer, firing the non-fired composite laminate under the conditions where at least the first ceramic green layer is sintered, and impregnating the porous ceramic layer with a resin to form a resin/ceramic composite layer.

It is preferable in the method for manufacturing a ceramic composite multilayer substrate of a preferred embodiment of the present invention that the second ceramic green layer be disposed between two or more of the first ceramic green layers.

It is still more preferable in the method for manufacturing a ceramic composite multilayer substrate of a preferred embodiment of the present invention that the second ceramic green layer be disposed between the first ceramic green layer and the third ceramic green layer.

It is still more preferable in the method for manufacturing a ceramic composite multilayer substrate of a preferred embodiment of the present invention that the third ceramic green layer be provided on both the principal surfaces of the non-fired laminate containing the first ceramic green layer and the second ceramic green layer.

It is still more preferable in the method for manufacturing a ceramic composite multilayer substrate of a preferred embodiment of the present invention that the third ceramic green layer be provided on only one principal surface of the non-fired laminate containing the first ceramic green layer and the second ceramic green layer.

It is still more preferable in the method for manufacturing a ceramic composite multilayer substrate of a preferred embodiment of the present invention to form a resin layer containing the resin as the main ingredients be formed on the surface of the resin/ceramic composite layer simultaneously with the formation of the resin/ceramic composite layer by impregnating the porous ceramic layer with the resin.

It is still more preferable in the method for manufacturing a ceramic composite multilayer substrate of the present invention that the resin layer be removed so that one principal surface of the surface electrode is exposed to the outside when the surface electrode is formed on the interface between the resin/ceramic layer and the resin layer and the surface electrode is covered with the resin layer in producing the resin layer.

It is still more preferable in the method for manufacturing a ceramic composite multilayer substrate of a preferred embodiment of the present invention to remove the resin layer so that at least one portion of the edge portion of the surface electrode is covered with the resin layer.

It is still more preferable in the method for manufacturing a ceramic composite multilayer substrate of a preferred embodiment of the present invention that a cavity be formed in the non-fired composite laminate so that at least the second ceramic green layer and the third ceramic green layer of the first ceramic green layer, the second ceramic green layer, and the third ceramic green layer are exposed to the side wall surface or the bottom surface.

It is still more preferable in the method for manufacturing a ceramic composite multilayer substrate of a preferred embodiment of the present invention to integrally fire the surface electrode and the non-fired composite laminate.

An electronic component according to a preferred embodiment of the present invention includes a laminate including a first ceramic layer and a second ceramic layer that is disposed so as to contact the first ceramic layer and suppresses firing shrinkage in the plane direction of the first ceramic layer, in which a mounting device is placed on one principal surface of a ceramic composite multilayer substrate including a resin/ceramic composite layer in which porous ceramic is impregnated with a resin on at least one principal surface of the laminate.

Preferred embodiments of the present invention can provide a high-reliability ceramic composite multilayer substrate that has excellent flatness and few remaining pores, can be produced at a low cost while simplifying the manufacturing process, and can eliminate layer separation or separation from a mother board, for example, a method for manufacturing the same, and electronic components.

These and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be described with reference to preferred embodiments shown in FIGS. 1 to 9. In the respective drawings, FIG. 1 is a cross sectional view schematically showing one preferred embodiment of a ceramic composite multilayer substrate of the present invention, FIGS. 2 to 6 each are cross sectional views schematically showing a manufacturing process of the ceramic composite multilayer substrate shown in FIG. 1, FIGS. 7 to 9 each are cross sectional views schematically showing other preferred embodiments of the ceramic composite multilayer substrate of the present invention, and FIGS. 10 and 11 each are cross sectional views schematically showing other aspects of a ceramic composite multilayer substrate.

First Preferred Embodiment

Figure 1:
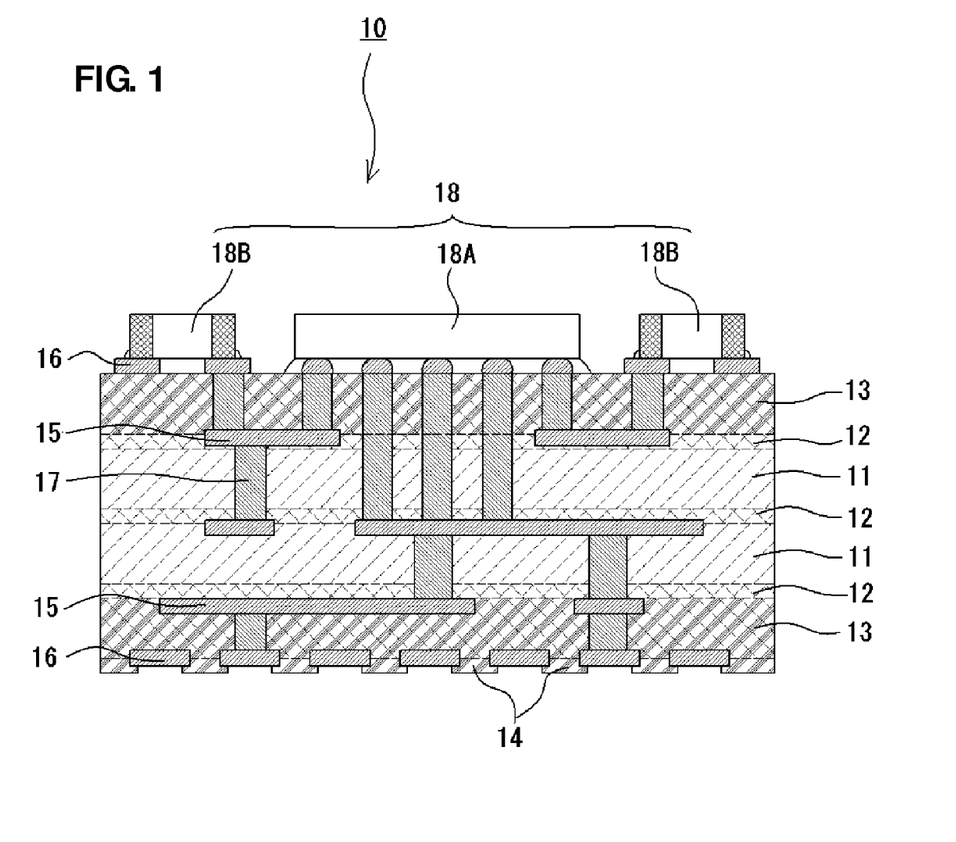
FIG. 1 is a cross sectional view schematically showing a preferred embodiment of a ceramic composite multilayer substrate of the present invention.

A ceramic composite multilayer substrate 10 of this preferred embodiment preferably includes, as shown in FIG. 1, for example, a first ceramic layer 11, a second ceramic layer 12 that is laminated so as to contact one principal surface (upper surface) of the first ceramic layer and functions as an internal constraining layer, and a resin/ceramic composite layer 13 that is laminated so as to contact the principal surface (upper surface) of the second ceramic layer 12 and is impregnated with a resin. On the other principal surface (undersurface) of the first ceramic layer 11, the second ceramic layer 12, the first ceramic layer 11, the second ceramic layer 12, and the resin/ceramic composite layer 13 are laminated toward the bottom in this order. When the first and second ceramic layers 11 and 12 and the resin/ceramic composite layer 13 are considered to be one composite laminate, the ceramic composite multilayer substrate 10 has another composite laminate laminated on the undersurface of the one composite laminate and integrated therewith with the second ceramic layer 12 interposed therebetween. Accordingly, the ceramic composite multilayer substrate 10 preferably has a laminate structure in which two composite laminates are disposed substantially vertically and symmetrically with the second ceramic layer 12 in the lamination direction as the center.

Furthermore, a resin layer 14 containing, as the main ingredients, a resin formed with the same material of the resin impregnated into the resin/ceramic composite layer 13 is disposed on the undersurface of the lower resin/ceramic composite layer 13.

In more detail, as shown in FIG. 1, an inner layer in-plane conductor (inner conductor) 15 is provided between each of the second ceramic layers 12 and the resin/ceramic composite layers 13 of both the upper and lower composite laminates and between the undersurface of the second ceramic layer 12 at the center in the lamination direction and the first ceramic layer 11. On each of both the upper and lower surfaces of the ceramic composite multilayer substrate 10, a surface layer in-plane conductor (surface electrode) 16 is provided. Interlayer connection conductors (via hole conductor) 17 are arranged to penetrate the first ceramic layers and/or the second ceramic layers 12, so that the inner conductors 15 and the surface electrodes 16 disposed at different layers are electrically connected to each other through the via-hole conductors 17 as required.

On one principal surface (upper surface) of the ceramic composite multilayer substrate 10, a surface mount device 18 including an active electronic component 18A, such as a semiconductor bare chip or a semiconductor package and passive electronic components 18B, such as a laminated ceramic condenser, is connected through the surface electrodes 16. In this preferred embodiment, the active electronic component 18A is electrically connected to the upper end surface exposed to the upper surface of the resin/ceramic composite layer 13 of the via-hole conductors 17 penetrating the composite laminate. The passive electronic components 18B are electrically connected to the surface electrodes 16 provided on the upper surface of the ceramic composite multilayer substrate 10. The active electronic component may be connected to the surface electrodes 16 and the passive electronic components 18B may be connected to the upper end surface of the via-hole conductors 17.

The surface electrodes 16 are also provided on the other principal surface (undersurface) of the ceramic composite multilayer substrate 10. The surface electrodes 16 are disposed on the surface of the resin/ceramic composite layer 13. With respect to the surface electrodes 16, at least one portion of the edge portion (outer peripheral portion) may be covered with the resin layer 14 and it is preferable that the outer peripheral portion be thoroughly covered with the resin layer 14. When the surface electrodes 16 are covered with the resin layer 14, the surface electrodes 16 are fixed to the surface of resin/ceramic composite layer 13 without separation. Portions near the inner center of the outer peripheral portion of the surface electrodes 16 are exposed to the outside, and the exposed surfaces serve as terminal electrodes for connection to a mother board (not shown), such as a printed-circuit board.

Thus, the first ceramic layer 11 is a ceramic layer in which a first ceramic green layer (FIG. 2) containing a first ceramic material is sintered and has a function of substantially controlling the substrate properties of the ceramic composite multilayer substrate 10. The thickness of the first ceramic layer 11 is preferably in the range of about 8 µm to about 100 µm, for example. The thickness of the first ceramic layer 11 is not always limited to the above-mentioned range and is preferably set to be equal to or lower than the maximum thickness allowing the first ceramic layer 11 to be constrained by the second ceramic layer 12 as an internal constraining layer. When two or more of the first ceramic layers 11 are provided, the thickness of each layer is not always the same. As the first ceramic material, ceramic materials that partially (e.g., glass ingredients) permeate into the second ceramic layer 12 or the resin/ceramic composite layer 13 during firing are preferably used. Usable as the first ceramic material are LTCC (Low Temperature Co-fired Ceramic) materials that can be co-fired with a conductor containing low melting metals, such as Ag or Cu, and can be fired at relatively low temperatures (e.g., 1000° C. or lower). Specifically, glass ceramics in which alumina and borosilicate glass are mixed, ceramics containing Ba—Al—Si—B oxides generating glass ingredients during firing, or the like can be used.

The second ceramic layer 12 preferably is a ceramic layer formed of the second ceramic green layer containing a second ceramic material. The second ceramic layer is adhered and solidified by, for example, permeation of a portion of the first ceramic material during firing and also can suppress shrinkage in the plane direction of the first ceramic layer 11. As the second ceramic material, high-temperature fired ceramic materials, such as $Al_2O_3$ or $ZrO$, are preferable and, in addition thereto, $TiO_2$, $SiO_2$, $Nb_2O_3$, and $Ta_2O_5$ can be used, for example. More specifically, the second ceramic layer 12 contains ceramic materials, whose sintering temperature is higher than that of the first ceramic material, in a substantially non-sintered state. Thus, the second ceramic layer 12 demonstrates the function of suppressing shrinkage in the plane direction to the first ceramic layer 11 in a firing process. As described above, since the second ceramic material is adhered and joined by the permeation of a portion of the first ceramic material, the thickness of the second ceramic layer 12 strictly depends on the state of the first second ceramic layers 11 and 12, desired constraining force, and firing conditions and is preferably in the range of about 1 µm to about 8 µm, for example, after firing. To the second ceramic material, a slight amount of glass ingredients may be added in advance. By adding an appropriate amount of glass ingredients to the second ceramic material, the constraining force can be maintained while increasing the density of the second ceramic layer 12 and increasing the mechanical strength. For example, for the second ceramic material, alumina ($Al_2O_3$) particles can be used as main raw materials and Si—B—Ba glass ingredients having a softening point of 600° C. to 780° C. can be used as subsidiary raw materials. In this case, the ratio of the alumina particles and the glass ingredients is preferably in the range of alumina:glass=50:50 to 70:30 (capacity %), for example.

The resin/ceramic composite layer 13 has a composite structure in which a resin is impregnated into a porous ceramic layer (porous ceramic layer) 13A (FIG. 4) after firing the third ceramic green layer containing the third ceramic material, and has a structure in which particularly ceramic powder is adhered to the resin. The resin/ceramic composite layer 13 contains a third ceramic material, whose sintering temperature is higher than that of the first ceramic material, in a substantially non-sintered state. Thus, the resin/ceramic composite layer also demonstrates the function of suppressing shrinkage in the plane direction in a firing process to the first ceramic layer 11 similarly as in the second ceramic layer 12. It is preferable that the third ceramic material constituting the resin/ceramic composite layer 13 be also the same ceramic material as the second ceramic material.

The resin/ceramic composite layers 13 are disposed on both the upper and lower surfaces of the ceramic composite multilayer substrate 10 while being exposed to the outside. Thus, in order to prevent deformation of the substrate during firing, achieve a stable resin-impregnated layer, or the like, it is preferable to increase the thickness of the resin/ceramic composite layer 13 to be higher than the thickness of the above-described second ceramic layer 12 by preferably about 20 µm or more, and the thickness thereof is more preferably about 40 µm or more, for example. When the thickness of the resin/ceramic composite layer 13 is excessively increased, the reduction in the height of the substrate and the impregnation of resin sometimes become difficult. Thus, it is preferable to set the upper limitation of the thickness to about 100 µm, for example. The resin/ceramic composite layer 13 has a function of regulating the shrinkage behavior of the first ceramic layer 11 in a firing process and a function as a resin-impregnated medium described later. Therefore, a slight amount of glass ingredients may be added in advance to the third ceramic material in a range such that these functions are not impaired. By adding an appropriate amount of glass ingredients to the third ceramic material, the mechanical strength can be increased to such an extent that the substrate shape can be easily maintained while changing the state to a porous state so that resin can be impregnated thereinto.

The porous ceramic layer 13A has a function as a resin-impregnated medium as described above. With respect to the porous ceramic layer 13A, the adjustment of the thermal expansion coefficient after the porous ceramic layer 13A is impregnated with a resin and cured as a resin-impregnated medium, i.e., the thermal expansion coefficient as the resin/ceramic composite layer 13, is important for flattening the ceramic composite multilayer substrate 10. As a method of adjusting the thermal expansion coefficient of the resin/ceramic composite layer 13, the thermal expansion coefficient of the resin/ceramic composite layer 13 can be changed as appropriate by adjusting the particle size and the particle size distribution of the high-temperature sintered ceramic materials, such as alumina, mainly used for the porous ceramic layer 13A to control the porosity of the porous ceramic layer 13A after sintering. The porosity of the porous ceramic layer 13A can also be controlled by adding in advance pore-forming materials, such as resin beads, to the third ceramic material. Furthermore, instead of adjusting the ratio of the resin beads and the third ceramic material, the thermal expansion coefficient may be adjusted by changing the thermal expansion coefficient of the resin itself to be impregnated or mixing two or more different kinds of high-temperature sintered ceramic materials to be used as the third ceramic material.

The second ceramic layer 12 may be able to substantially suppress the firing shrinkage of the first ceramic layer 11. In addition to the above-described aspects, the second ceramic layer 12 may be formed with ceramic materials different in the firing shrinkage behavior from the first ceramic layer 11 insofar as the adhesion with the first ceramic layer 11 can be secured. In this case, the second ceramic layer 12 may also be substantially sintered.

The resin layers 14 formed on the undersurface of the ceramic composite multilayer substrate 10 are preferably formed with the same resin as the resin impregnated in the resin/ceramic composite layer 13 in terms of the junction strength of the resin/ceramic composite layer 13 and the resin layer 14 or the productivity but may be resin of other materials.

For the inner conductors 15 and the surface electrodes 16, known conductive ingredients can be widely used insofar as conductive ingredients that can be co-fired with the first ceramic layer 11 are contained as the main ingredients. As the conductive ingredients, Cu, Ag, Ni, Pd, oxides thereof, and alloy ingredients can be used, for example. As the via-hole conductor 17, it is preferable to use a substance to which resin beads and glass ingredients are added in advance in addition to Cu components in order to reduce shrinkage behavior differences from the ceramic composite multilayer substrate 10. As the glass ingredients, it is preferable to use Si—B—Ba glass ingredients that have almost the same composition as that of glass as diffusion ingredients that diffuse from the first ceramic layer to the second ceramic layer 12 to fix the second ceramic layer 12.

Subsequently, one preferred embodiment of a method for manufacturing the ceramic composite multilayer substrate of the present invention will be described with reference to FIGS. 2 to 6.

First, Ba—Al—Si—B oxide ceramic materials, for example, are prepared as the first ceramic material. As the second ceramic material and the third ceramic material, a high-temperature sintered ceramic material is prepared in which alumina particles as main raw materials and Si—B—Ba glass ingredients as subsidiary raw materials whose softening point is 600° C. to 780° C. are mixed in such a manner as to achieve a ratio of alumina:glass=50:50 to 70:30 (capacity %). Subsequently, a binder, a solvent, a dispersing agent, etc., are added to the first ceramic material to prepare a first slurry, and the first slurry is shaped into a sheet by a doctor blade method or the like, thereby obtaining a first ceramic green sheet 111 serving as a first ceramic green layer 111'.

Similarly, a binder, a solvent, a dispersing agent, etc., are added to high-temperature sintered ceramic materials to prepare a second slurry and a third slurry, and the second slurry and the third slurry are shaped into a sheet by a doctor blade method or the like, thereby obtaining second and third ceramic green sheets 112 and 113 serving as second and third ceramic green layers 112' and 113', respectively.

Figure 2:
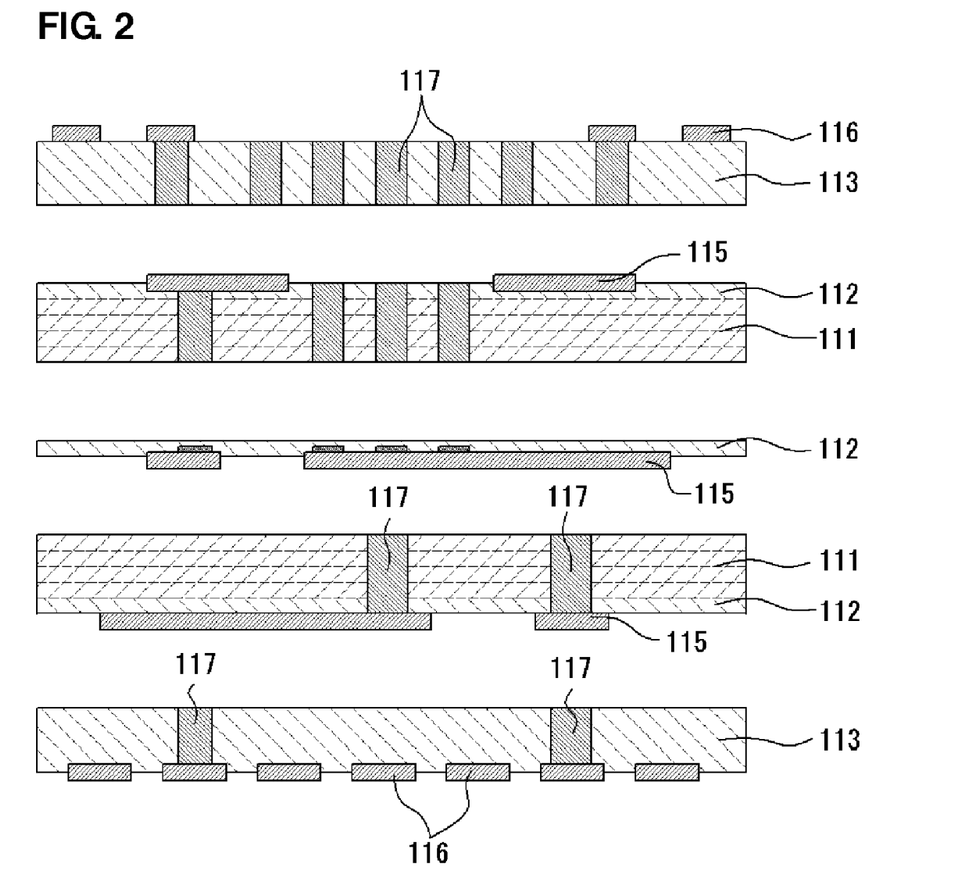
FIG. 2 is a cross sectional view schematically showing manufacturing processes of the ceramic composite multilayer substrate shown in FIG. 1.

Subsequently, as schematically shown in FIG. 2, in-plane conductor portions 115, via-hole conductor portions 117, and surface electrode portions 116 are disposed at appropriate positions on the first ceramic green sheet 111, the second ceramic green sheet 112, and the third ceramic green sheet 113, respectively. Here, when the second ceramic green sheet 112' is extremely thin as shown in FIG. 2, the handling properties are likely to decrease. Thus, it is preferable to use a composite ceramic sheet in which the second slurry is printed on the first ceramic green sheet 111 and the second ceramic green layer 112' is laminated as shown in FIG. 3.

Figure 3:
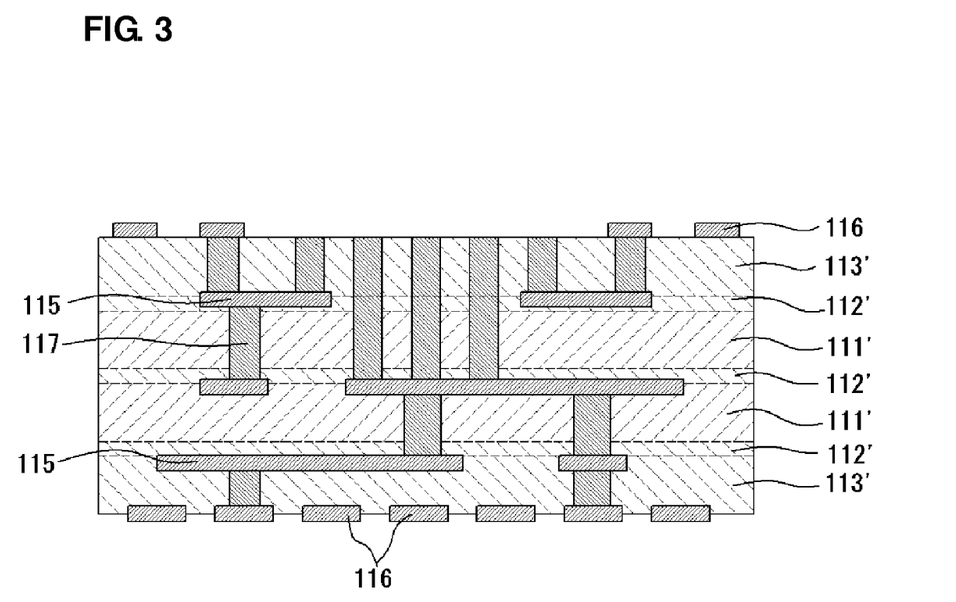
FIG. 3 is a cross sectional view schematically showing a process subsequent to the manufacturing process shown in FIG. 2 in the manufacturing processes of the ceramic composite multilayer substrate shown in FIG. 1.

The ceramic green sheets obtained as described above are laminated and bonded under pressure according to the order and the direction shown in FIG. 2, thereby obtaining a non-fired composite laminate in which the third ceramic green layers 113' serving as the resin/ceramic composite layers (porous ceramic layer) are formed on the principal surface of non-fired laminates in which the first ceramic green layers 111' serving as the first ceramic layers 11 and the second ceramic green layers 112' serving as the second ceramic layers 12 are laminated as shown in FIG. 3. In this preferred embodiment, the first ceramic green layers 111', the second ceramic green layers 112', and the third ceramic green layers 113' are disposed so that a pair of the non-fired composite laminates are disposed substantially vertically and symmetrically on the second ceramic layer 112' at the center in the lamination direction as shown in FIG. 3, and the third ceramic green layers 113' are disposed to form the upper and lower surfaces of the non-fired composite laminate.

Figure 4:
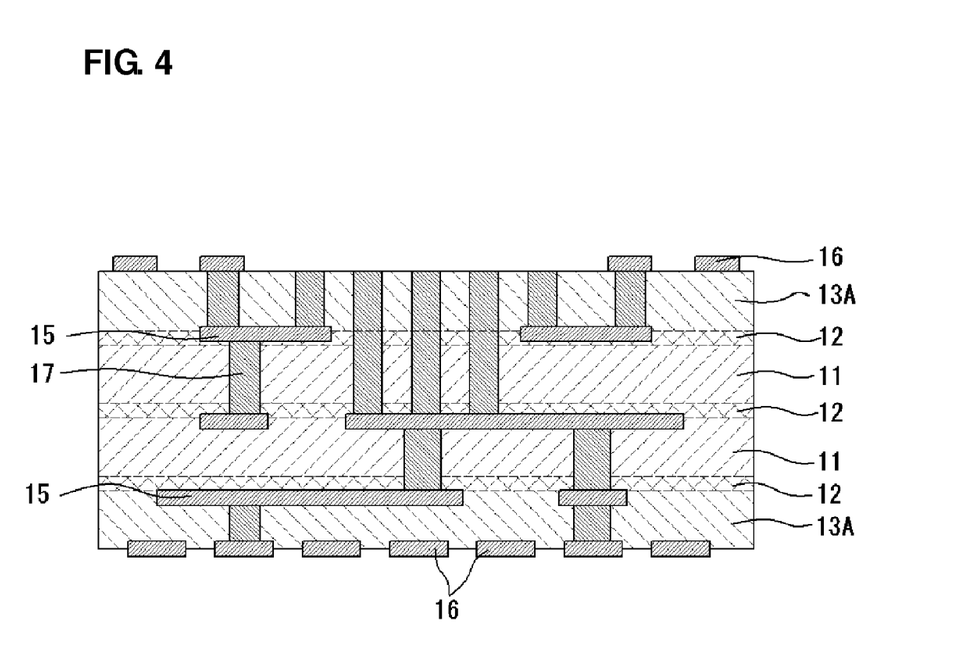
FIG. 4 is a cross sectional view schematically showing a process subsequent to the manufacturing process shown in FIG. 3 in the manufacturing processes of the ceramic composite multilayer substrate shown in FIG. 1.

Thereafter, the non-fired composite laminate is fired under the conditions where the temperature and the atmosphere are controlled to a given temperature and a given atmosphere, e.g., at TOP temperature conditions of 950° C. to 1000° C. under a reducing atmosphere, thereby obtaining a sintered compact of the non-fired composite laminate as shown in FIG. 4. The firing atmosphere in this case is adjusted as appropriate according to the type of the first ceramic material or the type of each conductive powder contained in conductive pastes serving as the inner conductor 15, the surface electrode 16, and the via-hole conductor 17. Here, the non-fired composite laminate is fired at a temperature at which the first ceramic green layer 111' is sintered and the second ceramic green layer 112' and the third ceramic green layer 113' are not sintered. Thus, when the first ceramic green layer 111' is shrinked during firing, the second ceramic green layer 112' and the third ceramic green layer 113' suppress shrinkage of the first ceramic green layer 111'. The first ceramic green layers 111' are sintered to become the first ceramic layers 11. The second ceramic green layers 112' become the second ceramic layers 12 in which the second ceramic material constituting the second ceramic green layers 112' disposed between the first ceramic green layers 111' is solidified in an adhered state by glass ingredients diffusing to the second ceramic green layers 112' during the sintering of the first ceramic green layers 111' and also the second ceramic green layers 112' disposed between the first ceramic green layer 111' and the third ceramic green layer 113' are adhered. The third ceramic green layers 113' are fired to become the porous ceramic layers 13A. In this firing, the firing shrinkage in the plane direction is suppressed by the second and third ceramic green layers 112' and 113' in the non-fired composite laminate, and thus a composite ceramic laminate 10 having high dimension accuracy in the plane direction can be obtained. The firing shrinkage in the first ceramic green layer 111' serving as a base material layer is suppressed by the second ceramic green layer 112'. Thus, the ceramic powder in the porous ceramic layers 13A is almost uniformly distributed and the density is also uniform throughout the layer.

Figure 5:
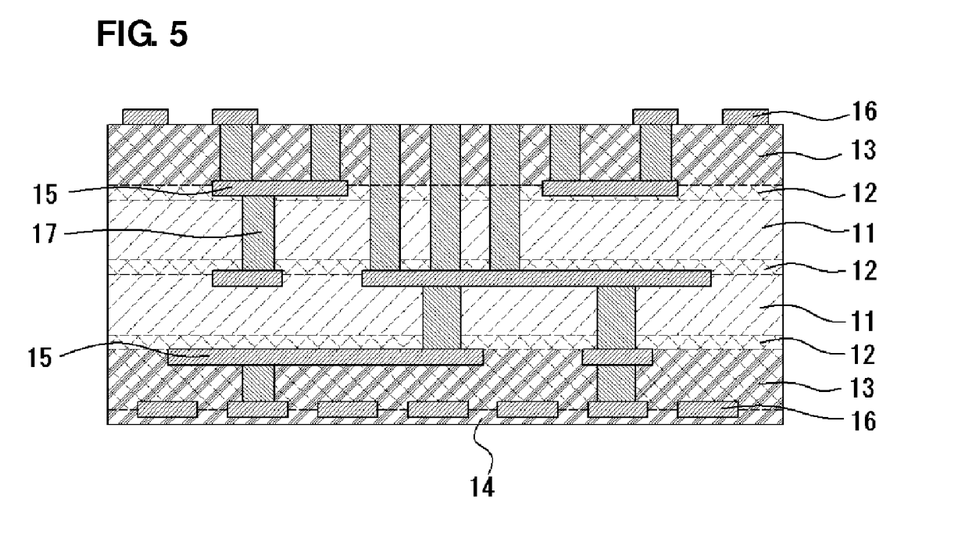
FIG. 5 is a cross sectional view equivalent to FIG. 1 showing a process subsequent to the manufacturing process shown in FIG. 4 among other preferred embodiments of the ceramic composite multilayer substrate of the present invention.

Next, as shown in FIG. 5, the porous ceramic layers 13A are impregnated with resin components in the obtained composite ceramic laminate, and then the resin components are cured. Particularly in this preferred embodiment, the density of the porous ceramic layers 13A derived from the third ceramic green layers 113' is almost uniform throughout the layers, i.e., the porosity (pores) is almost uniform throughout the layers. Thus, the resin is charged to the whole layers with a favorable efficiency and also in a manner of suppressing the remaining pore ratio to the minimum. As the resin components, known former resin components can be used. In this preferred embodiment, an epoxy thermosetting resin is used as typical resin components, for example. The impregnation of the resin components is preferably carried out under reduced pressure conditions or heating conditions in which the impregnation of the resin is promoted. In particular, when the surface electrodes are large relative to the thickness of the porous ceramic layers 13A, there is a possibility that the resin is difficult to reach the inner sides of the surface electrodes 16, and the portions are sufficiently impregnated with the resin. Thus, it is preferable to use the conditions described above in combination. As the resin to be impregnated, a resin not containing filler ingredients is preferable in order to improve the permeability. However, in order to adjust the thermal expansion coefficient after curing, a resin containing filler ingredients is preferable and the filler ingredients or the filler amount can be adjusted in a wide range insofar as the impregnation properties are not impaired. Even in this case, the content of the filler is preferably smaller than that of a common filler-containing resin. It is necessary to arrange the filler ingredients or the filler amount considering the composition ratio after a given amount of the resin components are diffused and impregnated into the porous ceramic layers 13A. Depending on the pore size of the porous ceramic layers 13A and the filler diameter, the thermal expansion coefficient can be sufficiently adjusted even when the porous ceramic layers 13A are impregnated with only the resin components using resins containing filler ingredients. In this case, by increasing the content of the resin to be impregnated into the porous ceramic layers 13A, a resin layer can be formed on the surface of the resin/ceramic composite layer 13 with a thickness of about 3 μm to about 30 μm, for example.

Figure 6:
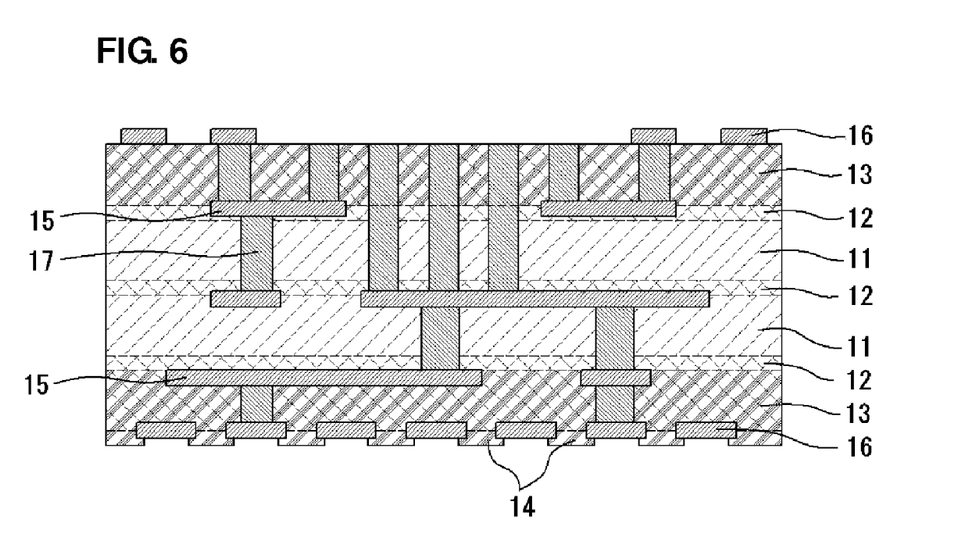
FIG. 6 is a cross sectional view equivalent to FIG. 1 showing a process subsequent to the manufacturing process shown in FIG. 5 among other preferred embodiments of the ceramic composite multilayer substrate of the present invention.

Next, as shown in FIG. 6, when portions serving as the surface electrodes 16 are covered more than necessary with the resin layer 14 after resin curing due to the impregnation of the resin components, the resin layer 14 is removed to expose the surface electrodes 16. Thus, the edge portions (at least one portion thereof and preferably the entire circumference) of the surface electrodes 16 are covered with the resin, and, as a result, the junction strength between the resin/ceramic composite layers 13 and the surface electrodes 16 increases. As methods for exposing the surface electrodes 16, known former cutting methods, such as polishing, can be used. In particular, it is preferable to use a laser in order to remove the resin layer 14 with high precision. In such a case, in order not to remove the resin layer 14 to the depth more than necessary, the metal density of the surface electrodes 16 is preferably high and a conductor foil, such as a copper foil, is preferable in addition to the above-described thick film conductor of sintered metal. When the copper foil is used for the surface electrodes 16, processing by $CO_2$ laser having a low absorption coefficient to copper is preferable. Here, the method of removing the resin of desired portions after curing of the impregnated resin is preferably used. An opening portion of the resin layer 14 can be formed also by applying a masking agent beforehand to the desired portions before resin impregnation, and then removing the masking agent after curing of the impregnated resin.

When a high-precision flatness is required in the ceramic composite multilayer substrate 10, flattening treatment by polishing can also be performed before and after exposing the surface electrodes 16, and, as required, the entire surface of the resin layer 14 of the surface layer may be polished off to such an extent that the surface electrodes 16 are not removed. Thereafter, the surface electrodes are surface-treated by performing electroless plating of Ni or Au, or the like, and then various mounting devices are placed thereon, thereby obtaining an electronic component (module product) in which various kinds of surface mount devices 18 are placed on the ceramic composite multilayer substrate 10 (FIG. 1). More specifically, each treatment described above is performed with an assembled substrate on which a large number of ceramic composite multilayer substrates 10 are arranged, the surface mount devices 18 are mounted using a solder material or the like, and the assembled substrate is divided at given positions, thereby obtaining separated ceramic composite multilayer substrates 10 and further a composite electronic component. As methods for mounting the surface mount devices 18 or methods for dividing the assembled substrate into separated substrates, known former methods can be used. For example, by dividing the assembled substrate using a dicer, each ceramic composite multilayer substrate 10 can be obtained. Moreover, the assembled substrate can be divided using a chocolate breaking method or the like in combination with the formation of dividing grooves by a dicer or the formation of grooves by laser processing. In the case of the formation of dividing grooves on the assembled substrate, the dividing grooves can be formed not only after mounting the surface mount devices 18 but before mounting the same. The obtained separated electronic components are mounted on a mother board, such as a printed-circuit board.

As described above, according to this preferred embodiment, the second ceramic green layer 112' and the third ceramic green layer 113' capable of suppressing the firing shrinkage in the plane direction of the first ceramic green layer 111' are disposed on the upper surface of the first ceramic green layer 111'. Thus, deformation of the substrate associated with firing is suppressed, and after firing, a flat ceramic composite multilayer substrate 10 can be obtained by the porous ceramic layers 13A formed from the third ceramic green layer 113' and having pores almost uniformly therethroughout. The ceramic composite multilayer substrate 10 is flattened due to the fact that deformation of the substrate is suppressed by the second ceramic green layer 112' and the third ceramic green layer 113' during firing. Thus, when the porous ceramic layers 13A derived from the third ceramic green layers 113' are removed after firing, for example, substrate deformation occurs again. Then, in this preferred embodiment, by impregnating resin components into the porous ceramic layers 13A, and then curing the resin components, the ceramic composite multilayer substrate 10 maintaining the first ceramic layer 11 in a flat state can be obtained without removing the porous ceramic layers 13A serving as the assembly of ceramic powder after firing. In this preferred embodiment, since the charging of resin can be stabilized, the ceramic composite multilayer substrate 10 that is excellent in reliability, that has less warpage or waviness and has few remaining pores can be obtained.

Also with respect to the flattening of the substrate after resin formation, when the surface electrodes 16 are formed before firing, the resin is impregnated after firing, and thus the flatness of the substrate and the surface electrodes 16 thereof can be secured. Moreover, since the substrate surface is flat, the flatness of the substrate can be further increased by polishing the resin surface to be flat with favorable accuracy after curing the resin components. When the surface electrodes 16 are formed after resin formation, the smoothness of the resin surface after forming the resin layer 14 greatly depends on the flatness of the resin layer 14, and there is a possibility that the surface electrodes 16 are removed depending on the surface state of the resin layer 14 when polishing the surface. Therefore, it is preferable to form in advance a necessary non-fired surface electrode 16 in a given pattern on the non-fired composite laminate as described above.

Furthermore, according to this preferred embodiment, the porous ceramic layer 13A is formed on at least one principal surface of the laminate containing the first ceramic layer 11 and the second ceramic layer 12 and is formed as the resin/ceramic composite layer 13 when the pores of the porous ceramic layer 13A are impregnated with resin components and cured. Thus, the mechanical strength as the resin/ceramic composite layer 13 becomes high and can prevent deformation of the ceramic composite laminate and can maintain the flat substrate shape. In contrast, when the thickness of a ceramic substrate is thin in the composite multilayer substrate of Japanese Unexamined Patent Application Publication No. 2005-223226, for example, a process for forming a resin layer more than once on one surface of the substrate is required. In this resin formation process, the resin layer is successively cured, and, depending on the curing state of each resin layer, the curing shrinkage behavior causes deformation of the ceramic substrate. Thus, each resin layer cannot be laminated in a flat manner, resulting in a possibility of poor formation, substrate cracking, etc.

According to this preferred embodiment, the surface electrodes 16 are disposed on the surface of the porous ceramic layer 13A at least one principal surface of which is impregnated with resin components and the resin layer 14 containing resin components is formed on a portion except the surface electrodes 16 of the surface of the resin/ceramic composite layer 13. Thus, the ceramic composite multilayer substrate 10 can be obtained simply by adding a resin impregnating and curing process to usual ceramic multilayer substrate manufacturing processes. The number of the manufacturing processes is not so different from that of the technique described in Japanese Unexamined Patent Application Publication No. 05-136572. Moreover, according to this preferred embodiment, when mounted on a known printed-circuit board through the surface electrodes 16 of the ceramic composite multilayer substrate 10, a gradient structure can be achieved in which the thermal expansion coefficient is gradually close to the thermal expansion coefficient of a printed-circuit board containing resin components from the center portion in the lamination direction of the substrate to the printed-circuit board similarly as in the composite multilayer substrate described in Japanese Unexamined Patent Application Publication No. 2005-210036. This is because the ceramic composite multilayer substrate 10 has a four-layer structure containing the first ceramic layer 11, the second ceramic layer 12 containing glass ingredients, the third ceramic layer (resin/ceramic composite layer) 13 containing resin components, and the resin layer 14.

According to this preferred embodiment, the resin layers 14 are simultaneously formed when the non-sintered porous ceramic layer 13A is impregnated with resin components, and thus the resin components are impregnated into the second ceramic layer 12 adhered with glass diffusing from the first ceramic layer 11. Thus, anchor effects are obtained at a junction interface, and layer separation can be suppressed. In contrast, since the resin layers 14 of Japanese Unexamined Patent Application Publication No. 2005-210036 and Japanese Unexamined Patent Application Publication No. 2005-223226 are additionally disposed on the ceramic multilayer substrate after firing, the separation problem is not avoided even after the resin layers 14 are potentially formed.

Furthermore according to this preferred embodiment, in a wiring conductor portion containing the inner conductors 15, the surface electrodes 16, and the via-hole conductors 17 in the porous ceramic layers 13A of the ceramic composite multilayer substrate 10, it is not necessary to directly form a wiring conductor before and after resin impregnation after firing when it is formed before the first, second, and third ceramic layers 11, 12, and 13 are fired. Therefore, with respect to the wiring conductor of the resin/ceramic composite layer 13 as a resin-impregnated layer, a high-precision wiring conductor can be formed according to the accuracy when forming the first and second ceramic layers 11 and 12. Particularly, since the porous ceramic layer 13A that does not suffer from sintering shrinkage in a firing process is disposed at the surface layer portion of the ceramic composite multilayer substrate 10, position change due to firing does not occur. The position of the surface electrodes can be controlled with high precision. In contrast, although the same applies even in Japanese Unexamined Patent Application Publication No. 05-136572, particularly in Japanese Unexamined Patent Application Publication No. 2005-223226, it is necessary to perform a wiring structure in which two or more of the resin layers 14 are electrically connected in each layer after the formation of the resin layer 14, resulting in a considerable increase in the number of processes and a reduction in formation accuracy, which is inconvenient for forming a high-density wiring substrate.

Second Preferred Embodiment

Figure 7:
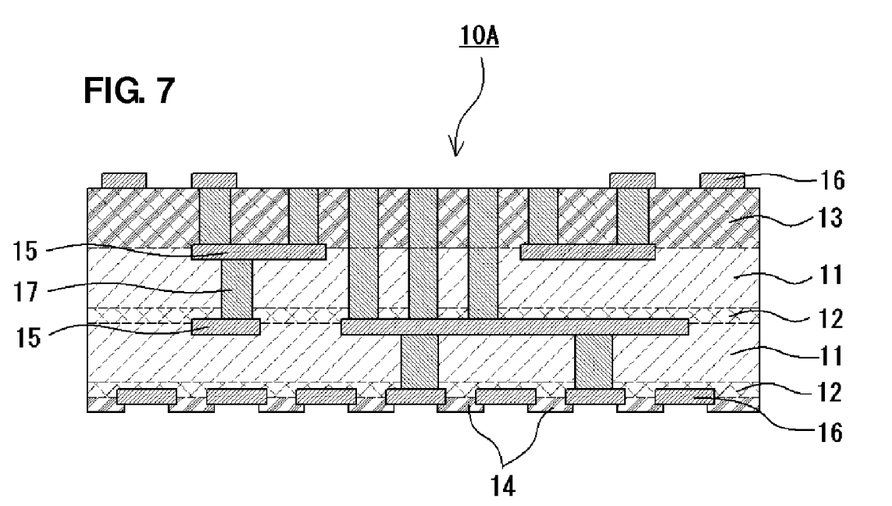
FIG. 7 is a cross sectional view schematically showing another preferred embodiment of the ceramic composite multilayer substrate of the present invention.

As shown in FIG. 7, a ceramic composite multilayer substrate 10A of this preferred embodiment is structured similarly as in the first preferred embodiment, except that the ceramic composite multilayer substrate 10A is not provided with the second ceramic layer 12 disposed between the first ceramic layer and the resin/ceramic composite layer 13 at the upper side and the resin/ceramic composite layer 13 at the lower side in the ceramic composite multilayer substrate 10 of the first preferred embodiment. Accordingly, the same reference numbers are used also in this preferred embodiment for components which are the same as or equivalent to those in the first preferred embodiment.

In order to obtain a flat substrate after firing, the porous ceramic layers 13A acting as a resin-impregnated layer are preferably disposed with the same thickness on both sides of the ceramic substrate. However, the structure is not limited to the above depending on the structure of the ceramic composite multilayer substrate. For example, when the ceramic composite multilayer substrate has a structure in which the second ceramic layer 12 is disposed in an unbalanced manner on one principal surface side (undersurface side) as in this preferred embodiment, this substrate alone has a tendency that the side (principal surface side having a large relative amount of the second ceramic layer) on which the second ceramic layer 12 is disposed in an unbalanced manner becomes a convex shape. In this case, by disposing the porous ceramic layer 13A only on one side, i.e., the other principal surface side (upper surface side), the flatness of the ceramic composite multilayer substrate 10A can be achieved. More specifically, in this preferred embodiment, the resin-impregnated layer is disposed only on one side by adjusting the layer structure of the ceramic composite multilayer substrate 10A. Also in this preferred embodiment, the same effects as those in the first preferred embodiment can be expected. By reducing the thickness of the porous ceramic layer 13A disposed at the principal surface on which the second ceramic layer 12 is disposed in an unbalanced manner than that of the porous ceramic layer 13A disposed at the other principal surface side in the ceramic composite multilayer substrate 10A, warpage of the ceramic substrate after firing can also be flattened.

Third Preferred Embodiment

Figure 8:
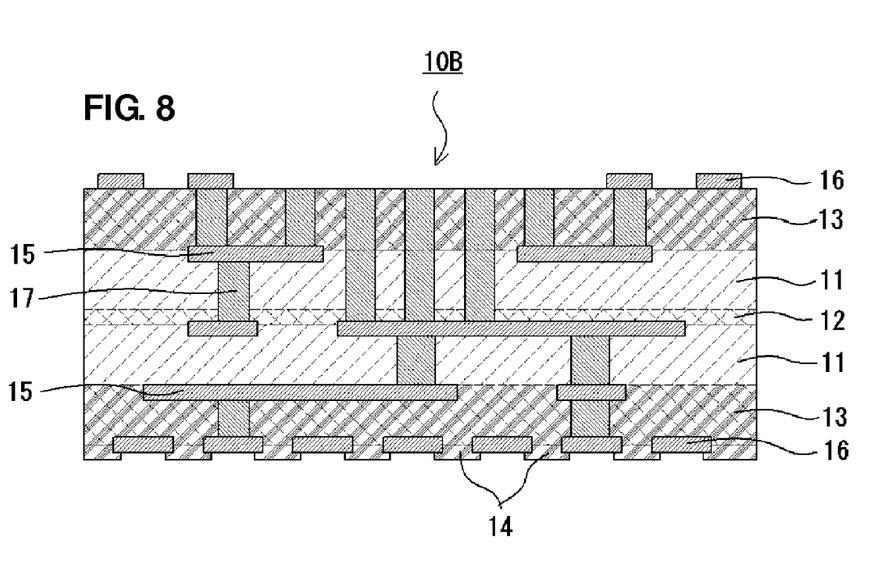
FIG. 8 is a cross sectional view schematically showing still another preferred embodiment of the ceramic composite multilayer substrate of the present invention.

As shown in FIG. 8, a ceramic composite multilayer substrate 10B of this preferred embodiment is structured similarly as in the first preferred embodiment, except that the second ceramic layers 12 disposed between the first ceramic layers 11 and the resin/ceramic composite layers 13 disposed at the upper and lower sides, respectively, in the ceramic composite multilayer substrates 10 of the first preferred embodiment are omitted. Accordingly, the same reference numbers are used also in this preferred embodiment for components that are the same as or equivalent to those in the first preferred embodiment.

In order to obtain a high-precision ceramic composite multilayer substrate 10 in which firing shrinkage in the in-plane direction is suppressed as in the ceramic composite multilayer substrate 10 of the first preferred embodiment, it is preferable to dispose the second ceramic layer 12 having a required thickness in the lamination direction for every at least 40 μm, for example, of thickness to thereby uniformly suppress in the lamination direction the firing shrinkage in the plane direction. However, for example, when the accuracy is not required so much in the in-plane direction of the ceramic composite multilayer substrate or when the thickness of the ceramic composite multilayer substrate is thin, particularly when the thickness of the first ceramic layer 11 is thin, the flatness as the ceramic composite multilayer substrate 10B can be maintained and substantially the same effects as those in the first preferred embodiment can be achieved even when the second ceramic layers between the first ceramic layers 11 and the resin/ceramic composite layers 13 are omitted as in this preferred embodiment.

Fourth Preferred Embodiment

Figure 9:
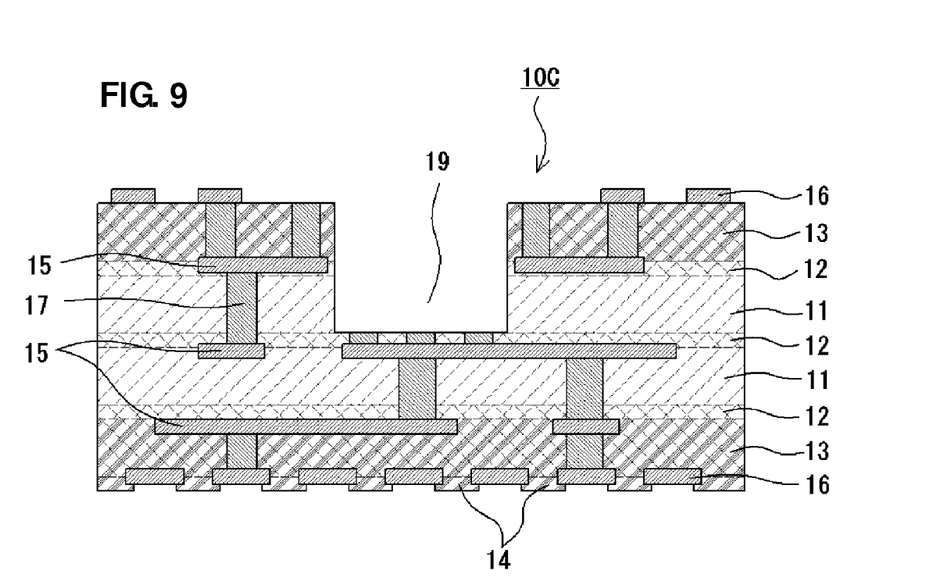
FIG. 9 is a cross sectional view schematically showing still another preferred embodiment of the ceramic composite multilayer substrate of the present invention.

As shown in FIG. 9, a ceramic composite multilayer substrate 10C of this preferred embodiment is structured similarly as in the first preferred embodiment, except that a cavity 19 is arranged to extend to the upper surface of the second ceramic layer 12 at the center in the lamination direction from the upper central portion of the resin/ceramic composite layer 13. Accordingly, the same reference numbers are used also in this preferred embodiment for components which are the same as or equivalent to those in the first preferred embodiment.

More specifically, in this preferred embodiment, the first ceramic layer 11, the second ceramic layer, and the resin/ceramic composite layer 13 are arranged to be exposed to the side wall surface of the cavity 19. Even in the ceramic composite multilayer substrate 10C having such a structure, the first ceramic layer 11 can suppress the firing shrinkage in the plane direction by the second ceramic layer 12. Thus, the ceramic composite multilayer substrate 10C with a cavity can be obtained in which the deformation as the ceramic composite multilayer substrate 10C is reduced and high-precision flatness is maintained. More specifically, since the second ceramic layer and the resin/ceramic composite layer 13 are exposed to the side wall surface or the bottom surface of the cavity 19, the shape of the cavity 19 is maintained by these layers also during firing, and thus the cavity 19 having a desired shape can be formed.

Hereinafter, test results of specific ceramic composite multilayer substrates will be described.

EXAMPLE 1

In this non-limiting example, the ceramic composite multilayer substrate shown in FIG. 1 was produced as follows. The flatness was evaluated using the ceramic composite multilayer substrate and the results are shown in Table 1.

In this Example, Ba—Al—Si—B oxide ceramic materials were used as the first ceramic material and alumina particles having an average particle diameter of 1.5 μm were used as the second and third ceramic materials in producing the ceramic composite multilayer substrate. It was designed so that the thickness of the first ceramic green layer was about 20 μm after firing, the thickness of the second ceramic green layer was about 3 μm after firing, and the thickness of the third ceramic green layer was about 40 μm after firing. Alumina particles having an average particle diameter of about 1.5 μm as the second and third ceramic materials were used and sintered alone. Then, the thermal expansion coefficient of the obtained fired materials was measured to be about 8 ppm/° C. With respect to the inner conductor, the surface electrode, and the via-hole conductor, conductor portions containing Cu ingredients as the main ingredients were formed. As the via-hole conductor, a substance in which resin beads and glass ingredients were added to the Cu ingredients were used in order to reduce shrinkage behavior differences with a non-fired composite laminate beforehand. As the glass ingredients, Si—B—Ba glass ingredients that have substantially the same composition as that of glass as diffusion ingredients that diffuse from the first ceramic layer toward the second ceramic layer and fix the second ceramic layer were used. As a resin to be impregnated into the porous ceramic layer containing the third ceramic material, a resin component that was adjusted so that the ratio of a filler containing, as the main ingredients, SiO having an average particle diameter of about 2.0 μm and a thermal expansion coefficient of about 8 ppm/° C. and an epoxy resin component was in a ratio of filler:epoxy resin component=50:50% by weight and a thermal expansion coefficient of the resin layer after curing was about 14 ppm/° C. was used.

The ceramic composite multilayer substrate shown in FIG. 1 was produced using each ceramic green sheet above according to the first preferred embodiment and the final substrate size was adjusted to be approximately 135 mm². The height difference between the four corners and the center of the ceramic composite multilayer substrate was measured, and the results are shown in Table 1. The average value of four points was defined as a substrate warpage. Moreover, the flatness of a portion equivalent to each substrate in the substrate was measured. As Comparative Example 1, the same substrate was produced without using the third ceramic green layer, i.e., in a state where the resin/ceramic composite layer was not formed. Furthermore, as Comparative Example 2, the substrate warpage after removing the porous ceramic layer by polishing after measuring the warpage in Example 1 was measured. In Comparative Example 2, the warpage before removing the porous ceramic layer was 100 μm. In Table 1, the composite layer refers to the resin/ceramic composite layer and the ceramic layer refers to the ceramic composite multilayer substrate.

TABLE 1

|  | Composite layer formation | Composite layer thickness [μm] | Ceramic layer thickness [μm] | Substrate warpage [μm] | Substrate waviness [μm] |
|---|---|---|---|---|---|
| Ex. 1 | Only upper surface | 40 | 500 | 230 | 30 (Formed side) |
|  | Only lower surface | 40 | 200 | 210 | 30 (Formed side) |
|  | Both principal surfaces | 40 + 40 | 500 | 100 | 30 |
|  | Both principal surfaces | 40 + 40 | 200 | 100 | 30 |
| Comp. Ex. 1 | Non-formed | — | 500 | 320 | 60 |
|  | Non-formed | — | 200 | 470 | 75 |
| Comp. Ex. 2 | Both surfaces and then removed | — | 500 | 290 |  |
|  | Both surfaces and then removed | — | 200 | 440 |  |

According to the results shown in Table 1, the substrate warpage was large in the case of Comparative Example 1 in which the resin/ceramic composite layer was not formed. It was found that particularly when the thickness of the substrate is thin, large warpage is likely to occur. It was found that, by forming the resin/ceramic composite layer as in Example 1, the warpage is reduced. In particular, disposing the resin/ceramic composite layers on both the principal surfaces was preferable for reduction in warpage. When the porous ceramic layer was removed after firing as in Comparative Example 2, the warpage occurred again. Thus, the removal thereof was not preferable. The results showed that since the third ceramic green layer suppresses deformation of the substrate during firing, a flat substrate is obtained.

According to the results shown in Table 1, also with respect to the waviness in each substrate, the resin/ceramic composite layer relieves and absorbs the appearance of level differences of the internal electrode and the like on the substrate surface, and thus a flat substrate surface was obtained.

EXAMPLE 2

In this non-limiting example, ceramic composite multilayer substrates were produced as follows and the thermal expansion coefficient difference, separation properties, and dimension accuracy of the ceramic composite multilayer substrates were evaluated, and the results were shown in Table 2. Moreover, the ceramic composite multilayer substrates of Example 1 were similarly evaluated, and the results were shown in Table 2.

In this example, a ceramic material formed so that alumina particles and borosilicate glass having a softening point of 600° C. were in a ratio of alumina:glass=60:40 (weight) was used as the first ceramic material and a material in which alumina particles having an average particle diameter of about 1.5 μm and glass which is an Si—B—Ba glass ingredient and has a softening point of about 730° C. were added and mixed in such a manner as to achieve a ratio of alumina:glass=60:40 (capacity %) was used as the second ceramic material in producing the ceramic composite multilayer substrate. The thickness of the first ceramic green layer was selected to be about 20 μm after firing and the thickness of the second ceramic green layer was selected to be about 3 μm after firing. With respect to the third ceramic green layer, mixed alumina in which alumina particles having an average particle diameter of about 1.5 μm and alumina particles having an average particle diameter of about 0.5 μm were mixed in such a manner as to achieve a ratio of alumina having an average particle diameter of about 1.5 μm:alumina having an average particle diameter of about 0.5 μm=1:3 (weight %) was used as the third ceramic material and the thickness after firing was selected to be about 40 μm. For the resin components to be impregnated into the porous ceramic layer and forming the resin layer, a material was used that was adjusted so that a filler containing $SiO_2$ having an average particle diameter of about 2.0 μm and a thermal expansion coefficient of about 8 ppm/° C. as the main ingredients and epoxy resin components were in a ratio of filler:resin=30:70 (% by weight) and the thermal expansion coefficient in the case of only the resin layer was about 12 ppm/° C. The ceramic composite multilayer substrate was produced in the same manner as in Example 1 other than the above respects. Subsequently, the thermal expansion coefficient of each layer in the ceramic composite multilayer substrates obtained in Examples 1 and 2 was measured, and the results were shown in Table 2.

TABLE 2

|  | Example 1 [ppm/° C.] | Example 2 [ppm/° C.] |
|---|---|---|
| Thermal expansion coefficient of printed-circuit board | 12 to 18 | 12 to 18 |
| Thermal expansion coefficient of resin layer | 14 | 12 |
| Thermal expansion coefficient of composite layer | 12 | 9 |
| Thermal expansion coefficient of ceramic layer | 13 | 7 |

The results shown in Table 2 showed that Examples 1 and 2 have a gradient structure layer in which the thermal expansion coefficient of each layer of the obtained ceramic composite multilayer substrates is gradually close to the thermal expansion coefficient of the printed-circuit board obtained by a small number of processes. Particularly in the substrate produced in this example, by adjusting the particle size of the alumina particles to be used to control the porosity of the porous ceramic layer, the thermal expansion coefficient of the resin/ceramic composite layer (the composite layer in Table 2) was adjusted and, even when a ceramic layer having a thermal expansion coefficient greatly different from that of the printed-circuit board was used as a base material layer, a substrate structure in which the thermal expansion coefficient is gradually close to the thermal expansion coefficient of the printed-circuit board was formed.

For comparison between the substrate used in Example 1 and the substrate of Comparative Example 1 having resin layers which were additionally formed on both the surfaces of the substrate and whose thickness was about 40 μm after curing, both the substrates were subjected to 120 cycles of a −40 to +85° C. thermal shock test, and separated portions were detected by Ultrasonic Testing. Then, in the substrate of Comparative Example 1, about φ20 um separations were observed here and there particularly in a portion having a level difference of the substrate surface. In contrast, separated portions did not arise in the substrate of Example 1. It was found that when a resin not containing a filler was used as the impregnated resin in Example 1 and a resin not containing a filler was used as the resin applied to both the surfaces of Comparative Example 1, wider separation occurs.

It was confirmed that, in Examples 1 and 2, separation does not occur when the thermal expansion coefficient difference between the layers adjacent to each other in the ceramic composite multilayer substrates, i.e., the thermal expansion coefficient difference between the second ceramic layer and the resin/ceramic composite layer and the thermal expansion coefficient difference between the resin/ceramic composite layer and the resin layer is at least about ±3 ppm/° C. or less. However, in preferred embodiments of the present invention, the resin/ceramic composite layer as the resin-impregnated layer is preferably formed beforehand, and the resin layer is preferably formed on the surface and simultaneously therewith a resin is impregnated, thereby forming a continuous interface, compared with a former method of additionally forming a resin layer on a resin layer after curing. Accordingly, the thermal expansion coefficient difference between each layer is not limited to the range mentioned above.

Even when the resin layer is singly formed in a comparative method, the thermal expansion coefficient can be adjusted by increasing the amount of filler ingredients so much. However, such resin before curing had poor flowability, and was difficult to form a uniform resin layer having no wet residue. In particular, resin wet near the surface mount device was poor and the resin strength of the resin layer itself also considerably decreased, causing degradation of reliability as ceramic electronic components, which was not preferable.

When the resin layers are additionally formed on both the surfaces of Comparative Example 1, it is necessary to form and cure the resin layer for each surface. In this case, when the resin at one side is cured, the substrate is warped due to the curing shrinkage behavior of the resin and cracks partially occurred in a 200 μm thin substrate. The warpage is relieved by forming and curing a resin layer on the other surface. However, it becomes necessary to form a uniform resin layer on the substrate having large warpage, and thus the difficulty of a process for forming the resin layer becomes high.

In contrast, in Example 2, the shape of the substrate itself is held by both the second ceramic layer and the porous ceramic layer or the resin cures in the pores in the porous ceramic layer. Thus, even when the resin is impregnated and cured for each surface, the substrate was not warped before and after the resin curing process and the operability was excellent.

Figure 10:
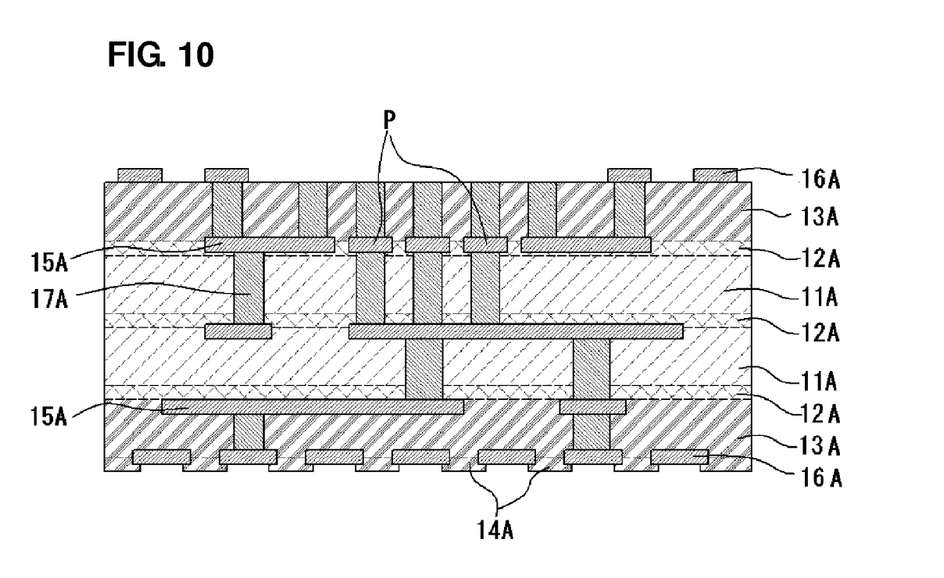
FIG. 10 is a cross sectional view schematically showing a ceramic composite multilayer substrate for comparison with the ceramic composite multilayer substrate shown in FIG. 1.

When the inner conductors and the surface electrodes are connected after forming the resin layer on the substrate of Comparative Example 1, a large design margin was required in order to secure the connectivity with the ceramic substrate. In the case of each Example above, connection to the surface electrodes can be achieved only with the via-hole conductors vertically disposed in series. However, in the case of Comparative Example 1, in order to absorb the position shift due to the disposition of the resin or the disposition of the via-hole conductors, pad electrodes P are additionally required as shown in FIG. 10, for example, and the pad electrodes P hinder a reduction in the gap between the via-hole conductors vertically disposed in series. In FIG. 10, "A" is given to the corresponding reference numbers of corresponding portions of the first preferred embodiment.

Figure 11:
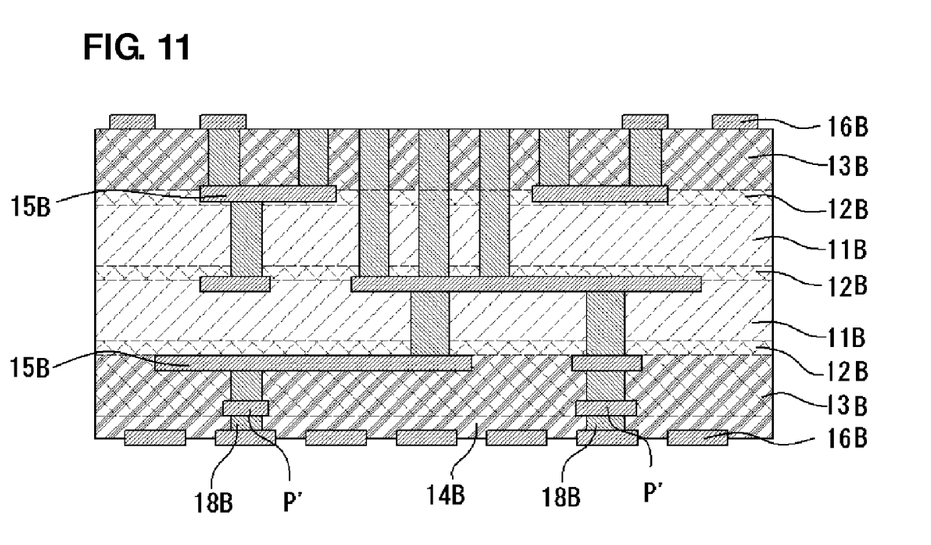
FIG. 11 is a cross sectional view schematically showing a ceramic composite multilayer substrate for comparison with the ceramic composite multilayer substrate shown in FIG. 1.

When a wiring accuracy of the substrate is not required, the impregnation of the porous ceramic layer with a resin and the formation of the resin layer may be simultaneously performed, and the surface electrodes may be additionally disposed after curing the resin in place of the above-described method. In this case, as shown in FIG. 11, for example, it is preferable to form beforehand pad electrodes P' on the surface of the resin/ceramic composite layer 13B considering the accuracy when forming via-hole conductors 18B on a resin layer 14B. As the surface electrodes 16B, metal foils, such as a copper foil, are preferable. When disposing the surface electrodes 16B, it is preferable to semi-cure the resin layer 14B once, dispose the surface electrodes 16B, and then cure the resin layer 14B. In this method, the wiring accuracy of the substrate decreases as described above, but the resin/ceramic composite layer 13B and the resin layer 14B are formed in a single resin impregnation operation and simultaneously cured. Thus, it is difficult for separation at the interface therebetween to occur. In addition thereto, a second ceramic layer 12B containing glass and high-temperature sintered ceramic particles is disposed between the first ceramic layers 11B used as base materials, advantages in that separation is difficult to occur between all the layers are not impaired, such as between a ceramic layer and a high-temperature sintered ceramic particle layer containing glass (between the first ceramic layer 11B and the second ceramic layer 12B), between the high-temperature sintered ceramic particle layer containing glass and the high-temperature sintered ceramic particle layers containing the resin layer (between the second ceramic layer 12B and the resin/ceramic composite layer 13B), and between the high-temperature sintered ceramic particle layer containing a resin and the resin layer (between the resin/ceramic composite layer 18B and the resin layers 14B). In FIG. 11, "B" is given to the corresponding reference numbers of corresponding portions of the first preferred embodiment.

As described above, according to a preferred embodiment of the present invention, the second ceramic green layer and the third ceramic green layer capable of suppressing the firing shrinkage in the plane direction of the first ceramic green layer are disposed on at least one principal surface of the first ceramic green layer. Thus, the deformation associated with firing is suppressed and, after firing, a flat ceramic composite multilayer substrate can be obtained by the porous ceramic layer derived from the third ceramic green layer. The ceramic composite multilayer substrate is flattened by suppressing deformation by the second ceramic green layer and the third ceramic green layer. Thus, when the porous ceramic layer derived from the third ceramic green layer is removed after firing, for example, the substrate deforms again. Then, in a preferred embodiment of the present invention, a ceramic composite multilayer substrate in a state where the flattened state is maintained can be obtained without removing the porous ceramic layer serving as the assembly of ceramic powder after firing by impregnating resin components into the porous ceramic layer and curing the same. In particular, since the firing shrinkage of the first ceramic green layer is substantially suppressed by the second ceramic green layer, stress to be applied to the third ceramic green layer and the interface thereof is reduced to the minimum. Accordingly, the porosity and the density each become substantially uniform, and a resin can be uniformly and smoothly impregnated.

Also with respect to the flattening of the substrate after resin formation, when the surface electrodes are formed before firing, a resin is impregnated after firing, and thus flattening of the substrate and the surface electrodes thereof can be secured. Since the substrate surface is flat, the flatness can be further increased by polishing the resin surface to be flat after resin curing. When the surface electrodes are formed after resin formation, the smoothness of the surface after the formation greatly depends on the flatness of the resin layer, and there is a possibility that the surfaces are removed. Thus, it is preferable to form a required conductor pattern beforehand on a non-fired composite laminate as described above.

When the thickness of the ceramic substrate is thin, a resin formation process is required to be performed more than once on one side of the substrate in particularly in Japanese Unexamined Patent Application Publication No. 2005-223226. In the resin formation process, a resin layer is successively cured. However, depending on the curing of the resin layer, deformation factors are given to the ceramic substrate due to the curing shrinkage behavior, resulting in poor formation of the resin layer and cracking of the substrate. In a preferred embodiment of the present invention, a high-strength deformation-suppressing layer, such as the porous ceramic layer, is formed on at least one principal surface of the laminate containing the first ceramic layer and the second ceramic layer and curing and impregnation of a resin is performed in a resin-impregnated layer. Thus, deformation of the ceramic composite laminate does not arise and a flat substrate shape can be maintained.

More preferably, in the ceramic composite multilayer substrate according to a preferred embodiment of the present invention, the surface electrodes are provided on the surface of the porous ceramic layer at least one main side of which was impregnated with resin components and a resin layer containing resin components is formed on portions except the surface electrodes of the surface of the resin/ceramic composite layer. It is found that the substrate of this structure can be obtained by mainly adding the resin impregnation and curing process to a common manufacturing process of a ceramic multilayer substrate and that the number of the processes is not different so much from that of Japanese Unexamined Patent Application Publication No. 05-136572. However, depending on the substrate having the above-described structure of a preferred embodiment of the present invention, when mounted on a known printed-circuit board using the surface electrodes, the substrate composition as viewed from the ceramic composite multilayer substrate side can achieve a four-layer structure of "First ceramic layer", "Second ceramic layer of ceramic+glass", "Third ceramic layer of ceramic+resin layer", and "Resin layer". Moreover, a gradient structure in which the thermal expansion coefficient is gradually close to that of a known printed-circuit board containing resin components, which can be shown in Japanese Unexamined Patent Application Publication No. 2005-210036, can be obtained by the same process as in Japanese Unexamined Patent Application Publication No. 05-136572.

The resin layers observed in Japanese Unexamined Patent Application Publication No. 2005-210036 and Japanese Unexamined Patent Application Publication No. 2005-223226 are additionally disposed on the ceramic multilayer substrate after firing, and thus the problem of separation after the formation thereof is not potentially avoided. In contrast, in a preferred embodiment of the present invention, the resin layer is preferably formed by impregnation of resin components into a non-sintered porous ceramic layer. As viewed from the resin-impregnated side of the porous ceramic layer, a high-temperature sintered ceramic green layer adhered with diffusion glass from the ceramic layer is formed. The impregnated resin is impregnated into the ceramic layer adhered by the glass ingredients. Accordingly, an anchor structure containing the same type of ceramic ingredients is formed at the junction interface, and thus separation can be suppressed.

Although the same applies in Japanese Unexamined Patent Application Publication No. 05-136572, particularly Japanese Unexamined Patent Application Publication No. 2005-223226 is required to perform a wiring structure of electrically connecting two or more resin layers for each layer after the formation of the resin layers, resulting in a possibility that the number of processes considerably increases and the formation accuracy decreases, and thus problems remain in the formation of a high-density substrate. When the wiring conductor in the porous ceramic layer of the ceramic composite multilayer substrate in a preferred embodiment of the present invention is formed before firing of the ceramic layer, a process of directly forming the wiring conductor is not required before and after the resin impregnation after firing. Therefore, with respect to the formation of the wiring conductor of the resin-impregnated layer, a high-precision wiring conductor according to the formation accuracy of the ceramic layer can be formed. Moreover, an increase in the precision of the surface electrode position can be promoted also from the viewpoint that, particularly on the surface layer surface, a layer that is not sintered and shrinked in a firing process is disposed, and thus position change due to firing does not occur.

The present invention is not limited to the preferred embodiments described above at all. The design of each component of the present invention can be changed as appropriate, as required.

The present invention can be preferably used for various electronic devices, such as mobile communication devices.

While the present invention has been described with respect to preferred embodiments thereof, it will be apparent to those skilled in the art that the disclosed invention may be modified in numerous ways and may assume many preferred embodiments other than those specifically set out and described above. Accordingly, it is intended by the appended claims to cover all modifications of the present invention that fall within the true spirit and scope of the present invention.

What is claimed is:

1. A ceramic composite multilayer substrate, comprising:
   a laminate including a first ceramic layer and a second ceramic layer arranged to contact the first ceramic layer and to suppress firing shrinkage in a plane direction of the first ceramic layer, and a resin/ceramic composite layer in which a porous ceramic layer is impregnated with a resin disposed on at least one principal surface; and
   a surface electrode including a portion embedded in at least a principal surface of the resin/ceramic composite layer; wherein
   the porous ceramic layer of the resin/ceramic composite layer is composed of a ceramic material having a sintering temperature higher than the sintering temperature of the first ceramic layer so as to suppress firing shrinkage in the plane direction of the first ceramic layer; and
   the surface electrode is composed of a sintered metal.

2. The ceramic composite multilayer substrate according to claim 1, wherein the second ceramic layer is disposed between a plurality of the first ceramic layers.

3. The ceramic composite multilayer substrate according to claim 1, wherein the second ceramic layer is disposed between the first ceramic layer and the resin/ceramic composite layer.

4. The ceramic composite multilayer substrate according to claim 1, wherein the resin/ceramic composite layer is disposed on each of both principal surfaces of the laminate including the first ceramic layer and the second ceramic layer.

5. The ceramic composite multilayer substrate according to claim 1, wherein the resin/ceramic composite layer is disposed only on one principal surface of the laminate containing the first ceramic layer and the second ceramic layer.

6. The ceramic composite multilayer substrate according to claim 1, wherein a resin layer including a resin as the main ingredients is disposed on the surface of the resin/ceramic composite layer.

7. The ceramic composite multilayer substrate according to claim 6, wherein the surface electrode is disposed on an interface between the resin/ceramic composite layer and the resin layer and one principal surface of the surface electrode is exposed to the outside.

8. The ceramic composite multilayer substrate according to claim 7, wherein at least one portion of an edge portion of the surface electrode is covered with the resin layer.

9. The ceramic composite multilayer substrate according to claim 8, wherein the resin layer covering at least one portion of the edge portion of the surface electrode is formed with a resin containing the same material as that of the resin contained in the resin/ceramic composite layer.

10. The ceramic composite multilayer substrate according to claim 1, wherein a cavity is formed in at least one principal surface and at least the second ceramic layer or the resin/ceramic composite layer among the first ceramic layer, the second ceramic layer, and the resin/ceramic composite layer is exposed to a bottom surface or a side wall surface of the cavity.

11. A method for manufacturing a ceramic composite multilayer substrate, comprising:
   producing a non-fired composite laminate in which a third ceramic green layer defining a porous ceramic layer after firing is provided on at least one principal surface of a non-fired laminate in which a second ceramic green layer capable of suppressing firing shrinkage in a plane direction of a first ceramic green layer is disposed on at least one principal surface of the first ceramic green layer, the porous ceramic layer including a surface electrode portion composed of a thick-film conductor disposed on a surface thereof, and the porous ceramic layer being composed of a ceramic material having a sintering temperature higher than a sintering temperature of the first ceramic green layer so as to be capable of suppressing firing shrinkage in the plane direction of the first ceramic green layer;
   laminating and pressure-bonding the third ceramic layer to produce a non-fired composite laminate in which at least a portion of the surface electrode portion is embedded in the third ceramic green layer;
   firing the non-fired composite laminate under conditions where at least the first ceramic green layer and the surface electrode portion are sintered; and
   impregnating the porous ceramic layer with a resin to form a resin/ceramic composite layer including a surface electrode composed of a sintered metal on a surface thereof.

12. The method for manufacturing a ceramic composite multilayer substrate according to claim 11, wherein the second ceramic green layer is disposed between a plurality of the first ceramic green layers.

13. The method for manufacturing a ceramic composite multilayer substrate according to claim 11, wherein the second ceramic green layer is disposed between the first ceramic green layer and the third ceramic green layer.

14. The method for manufacturing a ceramic composite multilayer substrate according to claim 11, wherein the third ceramic green layer is provided on each of both principal surfaces of the non-fired laminate containing the first ceramic green layer and the second ceramic green layer.

15. The method for manufacturing a ceramic composite multilayer substrate according to claim 11, wherein the third ceramic green layer is provided on only one principal surface of the non-fired laminate containing the first ceramic green layer and the second ceramic green layer.

16. The method for manufacturing a ceramic composite multilayer substrate according to claim 11, wherein the resin layer containing the resin as the main ingredients is formed on the surface of the resin/ceramic composite layer simultaneously with the formation of the resin/ceramic composite layer by impregnation of the porous ceramic layer with the resin.

17. The method for manufacturing a ceramic composite multilayer substrate according to claim 16, wherein the resin layer is removed so that one principal surface of the surface electrode is exposed to the outside when the surface electrode is formed on an interface between the resin/ceramic layer and the resin layer and the surface electrode is covered with the resin layer when producing the resin layer.

18. The method for manufacturing a ceramic composite multilayer substrate according to claim 17, wherein
   the resin layer is removed so that at least one portion of the edge portion of the surface electrode is covered with the resin layer.

19. The method for manufacturing a ceramic composite multilayer substrate according to claim 11, wherein a cavity is formed in the non-fired composite laminate so that at least the second ceramic green layer and the third ceramic green layer of the first ceramic green layer, the second ceramic green layer, and the third ceramic green layer are exposed to a bottom surface or a side wall surface.

20. An electronic component comprising:
   a ceramic composite multilayer substrate including a laminate comprising including a first ceramic layer and a second ceramic layer arranged to contact the first ceramic layer and to suppress firing shrinkage in a plane direction of the first ceramic layer;
   a resin/ceramic composite layer including a porous ceramic layer impregnated with a resin and stacked on at least one principal surface of the laminate;
   a surface electrode including a portion embedded in at least one principal surface of the resin/ceramic composite layer; and
   a mounting device disposed on the surface electrode; wherein
   the porous ceramic layer of the resin/ceramic composite layer is composed of a ceramic material having a sintering temperature higher than the sintering temperature of the first ceramic layer so as to suppress firing shrinkage in the plane direction of the first ceramic layer; and
   the surface electrode is made of a sintered metal.

* * * * *